(12) United States Patent
Sasaki et al.

(10) Patent No.: US 10,270,400 B2
(45) Date of Patent: *Apr. 23, 2019

(54) SEMICONDUCTOR DEVICE

(71) Applicant: Murata Manufacturing Co., Ltd., Kyoto (JP)

(72) Inventors: Kenji Sasaki, Nagaokakyo (JP); Kenichi Shimamoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/976,734

(22) Filed: May 10, 2018

(65) Prior Publication Data
US 2018/0262167 A1    Sep. 13, 2018

Related U.S. Application Data

(63) Continuation of application No. 15/673,811, filed on Aug. 10, 2017, now Pat. No. 10,003,307.
(Continued)

(51) Int. Cl.
*H01L 21/00* (2006.01)
*H03F 1/30* (2006.01)
(Continued)

(52) U.S. Cl.
CPC ........... *H03F 1/301* (2013.01); *H01L 23/367* (2013.01); *H01L 24/14* (2013.01); *H01L 24/17* (2013.01); *H01L 27/0248* (2013.01); *H01L 27/082* (2013.01); *H03F 3/193* (2013.01); *H03F 3/21* (2013.01); *H01L 24/13* (2013.01);

*H01L 2224/13013* (2013.01); *H01L 2224/1403* (2013.01); *H01L 2224/1415* (2013.01); *H01L 2224/16227* (2013.01);
(Continued)

(58) Field of Classification Search
CPC ...... H03F 1/301; H01L 24/14; H01L 27/0248
See application file for complete search history.

(56) References Cited

U.S. PATENT DOCUMENTS 9,281,346 B1 *  3/2016  Lim ..................... H01L 27/3223
9,547,020 B2 *  1/2017  Liukku ................. B81B 3/0078
(Continued)

FOREIGN PATENT DOCUMENTS

JP    2006-186159 A    7/2006

*Primary Examiner* — Laura M Menz
(74) *Attorney, Agent, or Firm* — Studebaker & Brackett PC

(57) ABSTRACT

A semiconductor device includes a semiconductor substrate having a principal surface which has a first side in a first direction and a second side in a second direction. A plurality of transistor arrays is formed in a region adjacent to the first side of the semiconductor substrate. A plurality of bumps include first and second bumps which are longer in the first direction. The distance between the first side and the first bump is shorter than the distance between the first side and the second bump. The plurality of transistor arrays include a first and a second transistor arrays. The first transistor array has a plurality of first unit transistors arranged along the first direction such that the first unit transistors overlap the first bump. The second transistor array has a plurality of second unit transistors arranged along the first direction such that the second unit transistors overlap the second bump.

20 Claims, 16 Drawing Sheets

Related U.S. Application Data

(60) Provisional application No. 62/379,336, filed on Aug. 25, 2016.

(51) Int. Cl.
*H01L 23/367* (2006.01)
*H01L 23/00* (2006.01)
*H01L 27/02* (2006.01)
*H01L 27/082* (2006.01)
*H03F 3/193* (2006.01)
*H03F 3/21* (2006.01)

(52) U.S. Cl.
CPC ............ *H01L 2224/1703* (2013.01); *H01L 2224/17519* (2013.01); *H03F 2200/451* (2013.01)

(56) References Cited

U.S. PATENT DOCUMENTS

| | | | |
|---|---|---|---|
| 10,003,307 B2 * | 6/2018 | Sasaki | H01L 24/17 |
| 2002/0180307 A1 * | 12/2002 | Taga | H03H 9/02834 310/313 R |
| 2005/0052442 A1 * | 3/2005 | Takenaka | G02F 1/13452 345/204 |
| 2009/0200640 A1 * | 8/2009 | Hosoi | H01L 27/101 257/536 |
| 2014/0029226 A1 * | 1/2014 | Abe | H05K 1/111 361/773 |
| 2014/0264737 A1 * | 9/2014 | Gouchi | H05K 1/186 257/531 |
| 2015/0316581 A1 * | 11/2015 | Liukku | B81B 3/0078 73/514.32 |
| 2016/0155830 A1 * | 6/2016 | Sasaki | H01L 29/41708 330/310 |
| 2016/0343837 A1 * | 11/2016 | Sasaki | H01L 29/41708 |
| 2017/0063328 A1 * | 3/2017 | Tochishita | H03H 9/1071 |
| 2017/0256583 A1 * | 9/2017 | Choi | G02F 1/13452 |
| 2017/0271243 A1 * | 9/2017 | Yosui | H01L 23/12 |
| 2017/0338172 A1 * | 11/2017 | Yosui | H01L 21/4853 |
| 2018/0062586 A1 * | 3/2018 | Sasaki | H01L 24/17 |
| 2018/0262167 A1 * | 9/2018 | Sasaki | H01L 24/17 |

* cited by examiner

FIG. 5

| semiconductor device | 100A | 100B | 100C | 100D | 100E | 100F | 100G | 100H | 1000 |
|---|---|---|---|---|---|---|---|---|---|
| | 4/4/4/4 | 3/3/5/5 | 3/5/3/5 | 4/4/4/4 | 3/3/5/5 | 3/3/5/5 | 3/5/3/5 | 3/5/3/5 | 4/4/4/4 |
| HBT Q1 | 87.2 | 82.3 | 85.0 | 87.9 | 85.7 | 83.3 | 88.4 | 85.5 | 90.6 |
| Q2 | 85.9 | 80.1 | 82.9 | 87.1 | 84.7 | 81.6 | 87.4 | 84.1 | 90.3 |
| Q3 | 85.1 | 79.6 | 82.0 | 86.5 | 84.1 | 81.1 | 86.7 | 83.6 | 90.0 |
| Q4 | 84.2 | 81.8 | 86.4 | 85.7 | 85.3 | 83.6 | 90.5 | 88.8 | 88.9 |
| Q5 | 86.1 | 79.8 | 86.1 | 88.2 | 84.3 | 82.5 | 90.7 | 88.9 | 89.6 |
| Q6 | 84.9 | 79.5 | 85.2 | 87.6 | 83.9 | 82.1 | 90.6 | 88.7 | 89.3 |
| Q7 | 84.1 | 85.0 | 84.7 | 87.3 | 87.1 | 86.0 | 90.0 | 88.2 | 89.1 |
| Q8 | 83.5 | 85.6 | 83.8 | 86.4 | 87.7 | 86.6 | 89.0 | 87.2 | 88.1 |
| Q9 | 82.4 | 85.6 | 80.4 | 83.3 | 87.8 | 86.7 | 82.4 | 81.3 | 84.3 |
| Q10 | 82.4 | 85.1 | 79.7 | 83.3 | 87.2 | 86.1 | 81.8 | 80.7 | 84.3 |
| Q11 | 82.3 | 83.9 | 79.3 | 83.3 | 86.1 | 85.0 | 81.4 | 80.3 | 84.3 |
| Q12 | 81.3 | 82.7 | 80.9 | 82.3 | 84.6 | 83.6 | 81.3 | 81.7 | 83.3 |
| Q13 | 79.5 | 83.1 | 81.2 | 80.3 | 85.1 | 84.0 | 83.1 | 82.1 | 81.2 |
| Q14 | 79.3 | 83.1 | 81.1 | 80.2 | 85.1 | 84.0 | 83.0 | 82.0 | 81.1 |
| Q15 | 79.2 | 82.6 | 80.7 | 80.1 | 84.5 | 83.5 | 82.6 | 81.5 | 81.0 |
| Q16 | 78.4 | 81.6 | 79.8 | 79.3 | 83.5 | 82.5 | 81.7 | 80.7 | 80.2 |
| max(°C) | 87.2 | 85.6 | 86.4 | 88.2 | 87.8 | 86.7 | 90.7 | 88.9 | 90.6 |
| min(°C) | 78.4 | 79.5 | 79.3 | 79.3 | 83.5 | 81.1 | 81.4 | 80.3 | 80.2 |
| max-min(°C) | 8.8 | 6.2 | 7.1 | 8.8 | 4.2 | 5.5 | 9.2 | 8.6 | 10.4 |
| average(°C) | 82.9 | 82.6 | 82.4 | 84.3 | 85.4 | 83.9 | 85.8 | 84.1 | 86.0 |
| σ | 2.73 | 2.11 | 2.37 | 3.16 | 1.38 | 1.76 | 3.70 | 3.28 | 3.86 |

FIG. 10

| semiconductor device | | 200A | 200B | 200C | 200D | 200E | 200F | 200G | 200O |
|---|---|---|---|---|---|---|---|---|
| | | 3/3/4/4 | 3/3/4/4 | 3/3/4/4 | 3/4/3/4 | 3/4/3/4 | 3/4/4/3 | 3/4/3/4 | 4/3/3/4 |
| HBT | Q1 | 88.9 | 85.3 | 86.3 | 86.9 | 87.5 | 90.7 | 90.3 | 92.4 |
| | Q2 | 87.8 | 83.0 | 84.5 | 84.6 | 85.9 | 89.7 | 89.3 | 92.0 |
| | Q3 | 87.2 | 82.4 | 84.0 | 83.8 | 85.4 | 89.0 | 88.6 | 91.7 |
| | Q4 | 88.2 | 84.6 | 86.4 | 87.2 | 89.3 | 91.5 | 91.0 | 90.6 |
| | Q5 | 87.1 | 82.3 | 85.2 | 85.9 | 88.8 | 91.1 | 90.7 | 89.4 |
| | Q6 | 86.7 | 82.0 | 84.8 | 85.1 | 88.6 | 90.9 | 90.5 | 88.4 |
| | Q7 | 86.8 | 84.7 | 85.7 | 84.5 | 87.6 | 89.9 | 89.5 | 87.9 |
| | Q8 | 86.9 | 84.7 | 85.8 | 81.9 | 82.8 | 86.0 | 83.9 | 83.8 |
| | Q9 | 86.9 | 84.7 | 85.8 | 81.2 | 82.1 | 86.0 | 83.3 | 83.1 |
| | Q10 | 85.8 | 83.6 | 84.7 | 80.8 | 81.8 | 86.0 | 82.9 | 82.8 |
| | Q11 | 84.1 | 82.1 | 83.1 | 81.1 | 81.9 | 85.0 | 83.0 | 82.8 |
| | Q12 | 84.0 | 82.0 | 83.0 | 80.9 | 81.7 | 80.7 | 82.8 | 82.6 |
| | Q13 | 83.9 | 82.0 | 82.9 | 80.8 | 81.7 | 79.8 | 82.7 | 82.6 |
| | Q14 | 83.1 | 81.1 | 82.0 | 80.0 | 80.9 | 79.7 | 81.9 | 81.8 |
| max(°C) | | 88.9 | 85.3 | 86.4 | 87.2 | 89.3 | 91.5 | 91.0 | 92.4 |
| min(°C) | | 83.1 | 81.1 | 82.0 | 80.0 | 80.9 | 79.7 | 81.9 | 81.8 |
| max−min(°C) | | 5.9 | 4.3 | 4.4 | 7.2 | 8.4 | 11.8 | 9.1 | 10.5 |
| average(°C) | | 86.2 | 83.2 | 84.6 | 83.2 | 84.7 | 86.9 | 86.5 | 86.6 |
| σ | | 1.79 | 1.39 | 1.40 | 2.52 | 3.17 | 4.28 | 3.74 | 4.12 |

FIG. 15

| semiconductor device | 300A | 400A | 3000 | 4000 |
|---|---|---|---|---|
| | 3/3/4/4 | 3/3/4/4 | 4/3/3/4 | 4/3/3/4 |
| HBT Q1 | 82.0 | 75.8 | 90.4 | 82.3 |
| Q2 | 80.7 | 74.8 | 90.3 | 82.1 |
| Q3 | 79.8 | 74.1 | 90.1 | 82.0 |
| Q4 | 81.2 | 75.3 | 89.0 | 81.1 |
| Q5 | 80.2 | 74.5 | 86.4 | 80.7 |
| Q6 | 79.6 | 73.9 | 86.0 | 80.4 |
| Q7 | 83.1 | 75.9 | 85.3 | 79.8 |
| Q8 | 83.2 | 76.0 | 82.4 | 76.1 |
| Q9 | 83.1 | 76.0 | 82.2 | 75.9 |
| Q10 | 82.0 | 75.1 | 81.5 | 75.4 |
| Q11 | 79.3 | 74.0 | 80.8 | 74.6 |
| Q12 | 79.5 | 74.1 | 80.9 | 74.7 |
| Q13 | 79.4 | 74.1 | 80.9 | 74.7 |
| Q14 | 78.5 | 73.3 | 79.9 | 73.9 |
| max(°C) | 83.2 | 76.0 | 90.4 | 82.3 |
| min(°C) | 78.5 | 73.3 | 79.9 | 73.9 |
| max−min(°C) | 4.7 | 2.7 | 10.5 | 8.3 |
| average(°C) | 80.8 | 74.8 | 84.7 | 78.1 |
| σ | 1.60 | 0.90 | 3.97 | 3.29 |

SEMICONDUCTOR DEVICE

CROSS REFERENCE TO RELATED APPLICATIONS

This application is a Continuation Application of U.S. patent application Ser. No. 15/673,811 filed Aug. 10, 2017, which claims benefit of priority to U.S. Provisional Application No. 62/379,336 filed Aug. 25, 2016, the entire content of which is incorporated herein by reference.

TECHNICAL FIELD

The present disclosure relates to a semiconductor device.

BACKGROUND

Mobile equipment, such as a cellular phone, uses a power amplifier circuit to amplify the power of a radio frequency (RF) signal to be transmitted to a base station. The power amplifier circuit can employ a configuration in which a plurality of unit transistors connected in parallel are arranged on a semiconductor substrate (hereinafter referred to also as "the multi-finger configuration") in order to satisfy the requirement for a high output power level.

In the foregoing multi-finger configuration, a variation in temperature may take place among the unit transistors, depending on the placement of the unit transistors. Transistors generally have a temperature characteristic in which current passing therethrough increases as the temperatures thereof increase. This poses a problem in that a variation in temperature among a plurality of unit transistors causes more current to pass through unit transistors having relatively high temperatures, thus leading to shortage of output power or deterioration of power efficiency and further to destruction of the transistors due to thermal runaway.

As a solution to the aforesaid problem, Japanese Laid-Open Patent Publication No. 2006-186159, for example, describes a configuration in which a plurality of unit transistors are arranged such that fewer unit transistors are placed on the inner side of a semiconductor substrate than unit transistors placed on the outer side of the semiconductor substrate. According to the configuration, the variation in temperature of the entire substrate is reduced by placing a smaller number of unit transistors on the inner side on the premise that the temperature on the inner side of a semiconductor substrate is the highest.

However, in Japanese Laid-Open Patent Publication No. 2006-186159, the difference in the degree of heat dissipation in a semiconductor substrate is not considered. More specifically, heat does not necessarily stay on the inner side of the semiconductor substrate and, for example, the outer side of the semiconductor substrate is closer to an outer frame, so that the region of heat dissipation is limited. Hence, the degree of heat dissipation may be lower than that on the inner side. In this case, the temperatures of the unit transistors arranged on the outer side of the semiconductor substrate may excessively increase.

SUMMARY

The present disclosure has been made in view of the background described above, and it is an object of the disclosure to provide a semiconductor device that achieves a decrease in the maximum temperature of a plurality of unit transistors or a reduction in temperature variation.

To this end, a semiconductor device in accordance with one aspect of the present disclosure includes a semiconductor substrate having an approximately rectangular principal surface, which has a first side in a first direction and a second side in a second direction intersecting with the first direction. A plurality of transistor arrays is formed in a region of the semiconductor substrate. The region is adjacent to the first side relative to a centerline extending in the first direction of the semiconductor substrate. A plurality of bumps is formed in the region adjacent to the first side. The plurality of bumps include a first bump and a second bump, the lengths of which in the first direction are greater than the lengths in the second direction in a planar view of the principal surface of the semiconductor substrate. The first bump and the second bump are placed along the second direction such that the distance between the first side and the first bump in the second direction is shorter than the distance between the first side and the second bump in the second direction in a planar view of the principal surface of the semiconductor substrate. The plurality of transistor arrays include a first transistor array and a second transistor array arranged along the second direction. The first transistor array has a plurality of first unit transistors arranged along the first direction such that the first unit transistors at least partly overlap the first bump in a planar view of the principal surface of the semiconductor substrate. The second transistor array has a plurality of second unit transistors arranged along the first direction such that the second unit transistors at least partly overlap the second bump in a planar view of the principal surface of the semiconductor substrate. The area of the first bump per one of the plurality of first unit transistors is larger than the area of the second bump per one of the plurality of second unit transistors in a planar view of the principal surface of the semiconductor substrate.

According to the present disclosure, a semiconductor device capable of achieving a decrease in maximum temperature or a reduction in temperature variation of a plurality of unit transistors can be provided.

BRIEF DESCRIPTION OF DRAWINGS

FIG. 5 illustrates simulation results indicating the temperature of each unit transistor in the first embodiment of the present disclosure and a modification example of the first embodiment and a comparative example.

FIG. 10 illustrates simulation results indicating the temperature of each unit transistor in the second embodiment of the present disclosure and a modification example of the second embodiment and a comparative example.

FIG. 15 illustrates simulation results indicating the temperature of each unit transistor in the third embodiment and the fourth embodiment of the present disclosure, the comparative example, and the reference example.

DETAILED DESCRIPTION

Figure 1:
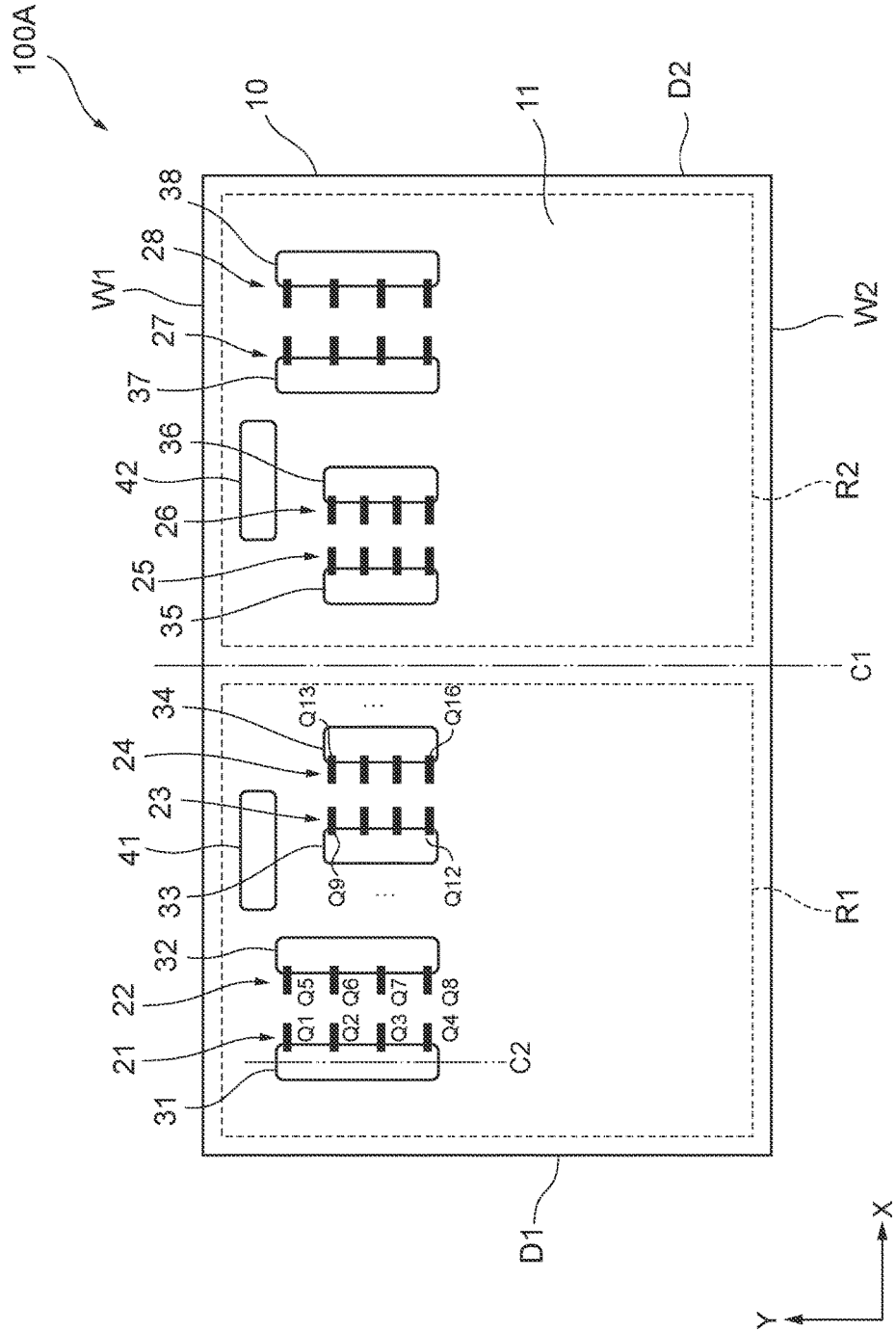
FIG. 1 is a plan view of a semiconductor device 100A according to a first embodiment of the present disclosure.

The following will describe in detail the embodiments of the present disclosure with reference to the accompanying drawings. In the following description of the drawings, the same or similar constituent elements will be denoted by the same or similar reference numerals. The drawings are illustrative, and the dimensions and shapes of parts are schematic. The technological scope of the present disclosure should not be interpreted by limiting to the embodiments.

Figure 2:
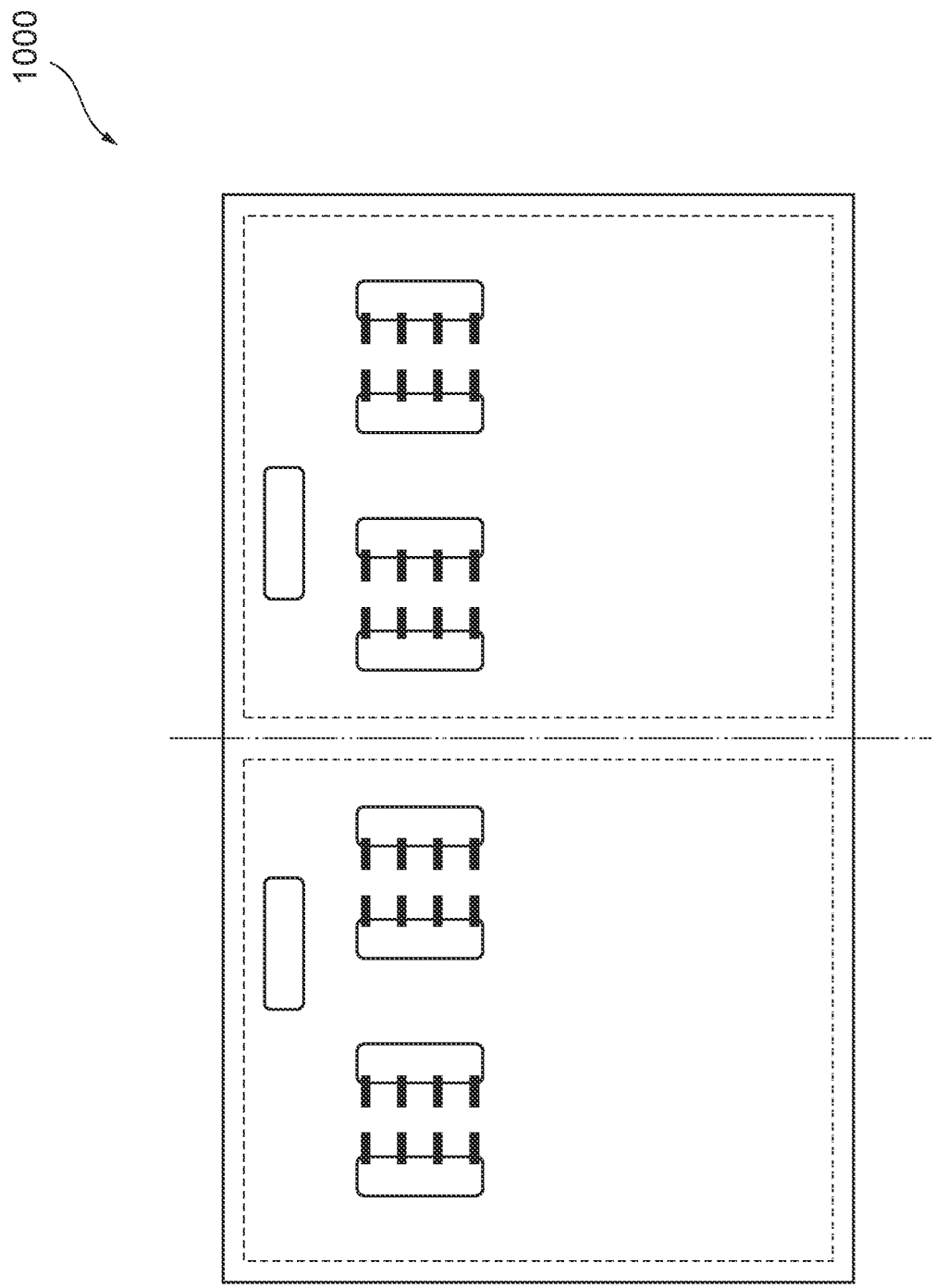
FIG. 2 is a plan view of a comparative example (a semiconductor device 1000) of the first embodiment of the present disclosure.

FIG. 1 is a plan view of a semiconductor device 100A according to a first embodiment of the present disclosure. FIG. 2 is a plan view of a comparative example (a semiconductor device 1000) of the first embodiment of the present disclosure. There are no particular restrictions on an application example of the semiconductor device 100A. In the present specification, a description will be given of the semiconductor device 100A as an application example of an amplifier that amplifies a radio frequency (RF) signal and outputs the amplified signal in, for example, a power amplifier circuit. If the power amplifier circuit has amplifiers of a plurality of stages, then the semiconductor device 100A is especially effectively used as, for example, a final stage amplifier. This is because a final stage amplifier has larger output power than the amplifiers of other stages and has more unit transistors connected in parallel than the amplifiers in other stages.

Referring to FIG. 1, the semiconductor device 100A includes, for example, a semiconductor substrate 10, transistor arrays 21 to 28, and bumps 31 to 38, 41, and 42. More specifically, the semiconductor device 100A has a flip-chip structure and is composed of a chip installed on a mounting substrate by the bumps 31 to 38. In FIG. 1, other constituent elements of the power amplifier are not illustrated.

The semiconductor substrate 10 has a principal surface 11, which is parallel to an XY plane. The principal surface 11 has an approximately rectangular shape which has short sides D1 (a first side), D2, which are parallel to a Y-axis (a first direction), and long sides W1 (a second side), W2, which are parallel to an X-axis (a second direction), which intersects with (orthogonal to, in FIG. 1) the Y-axis. Hereinafter, the short sides D1, D2 and the long sides W1, W2 will be referred to also as "the outer frames." The material of the semiconductor substrate 10 is a compound semiconductor of, for example, GaAs, although not particularly restricted thereto.

A plurality of transistor arrays 21 to 28 are formed on the principal surface 11 of the semiconductor substrate 10. To be specific, in the planar view of the principal surface 11, the transistor arrays 21 to 24 are formed along the X-axis direction in a region R1 adjacent to the short side D1 with respect to a centerline C1 extending in the Y-axis direction in the semiconductor substrate 10, and the transistor arrays 25 to 28 are formed along the X-axis direction in a region R2 adjacent to the short side D2. The term "transistor array" means an array of a plurality of unit transistors arranged in line, which will be discussed later.

The transistor arrays 21 to 24 formed in the region R1 constitute one amplifier, and the transistor arrays 25 to 28 formed in the region R2 constitute the other amplifier. In other words, the two amplifiers are formed in the semiconductor device 100A. The two amplifiers are properly used according to, for example, the communications standard of RF signals to be amplified, frequency bands or the like. In the simulations, which will be discussed later, the two amplifiers do not simultaneously operate, so that if one of the amplifiers performs an amplifying operation, then the other amplifier does not perform the amplifying operation (i.e. one region does not exert an influence of heat generation onto the other region).

Each of the transistor arrays 21 to 28 includes a plurality of unit transistors. Taking the region R1 as an example, the transistor arrays 21 to 24 include four unit transistors each, namely, Q1 to Q4 (first unit transistors), Q5 to Q8, Q9 to Q12 (second unit transistors), and Q13 to Q16, respectively, which are arranged in line along the Y-axis direction. The unit transistors Q1 to Q16 are bipolar transistors, such as heterojunction bipolar transistors (HBT), although not particularly restricted thereto. The term "unit transistor" refers to a structure of a minimum unit functioning as a transistor that includes at least a base layer, a collector layer, and an emitter layer. Although not illustrated, an additional element, such as a base ballast resistor or a capacitor, may be connected to the base of each unit transistor, and the unit transistor and the additional elements may constitute a single unit cell. Further, the unit transistors may be other types of transistors, such as field effect transistors (e.g. metal-oxide semiconductor field-effect transistors (MOSFETs)). In this case, the base, the collector, and the emitter are replaced by a gate, a drain, and a source, respectively.

The unit transistors Q1 to Q16 have their collectors, emitters, and bases electrically interconnected. This constitutes a multi-finger configuration, in which the unit transistors Q1 to Q16 are connected in parallel, thus operating like a single transistor as a whole.

The plurality of bumps 31 to 38 are formed according to the placement of the transistor arrays 21 to 28. More specifically, on the principal surface 11 of the semiconductor substrate 10, the bumps 31 to 34 are formed in the region R1 along the X-axis direction, and the bumps 35 to 38 are formed in the region R2 along the X-axis direction. In each of the bumps 31 to 38, the length in the Y-axis direction is greater than the length in the X-axis direction, thus shaping the bumps 31 to 38 to be long along the Y-axis direction in the planar view of the principal surface 11. In FIG. 1, the unit transistors are illustrated, being placed on the bumps to indicate the positional relationship between the bumps and the unit transistors. In reality, however, the unit transistors are formed on the principal surface 11 of the semiconductor substrate 10 and then the bumps are formed on the unit transistors.

The bumps 31 to 38 are electrically connected to the emitters of the unit transistors included in the transistor arrays 21 to 28 and function as emitter terminals. Further, when mounting the semiconductor substrate 10, the bumps 31 to 38 are electrically connected to a ground terminal in the mounting substrate, thereby connecting the emitters of the unit transistors to ground. The electrical connection of the bumps 31 to 38 to the emitters, through which more current passes than through other terminals, enhances the effect for reducing a temperature rise, as compared with the case where the bumps 31 to 38 are connected to other terminals. In the present specification, the configuration in which the bumps 31 to 38 are connected to the emitters of the unit transistors will be described as an example. However, the terminals to which the bumps 31 to 38 are connected are not limited to the emitters and may alternatively be connected to other terminals, such as collectors.

The bumps 41 and 42 are electrically connected to the collectors of the unit transistors formed in the regions R1 and R2, respectively, and function as collector terminals.

A detailed description will now be given of the placement of the unit transistors and the bumps. The constituent elements formed in the two regions R1, R2 are symmetrically arranged with respect to the centerline C1, so that one of the regions, namely, R1, will be described below, and a description of the other region, R2, will be omitted.

Referring to FIG. 1, the bumps 31 (the first bump) and 32 are arranged at positions closer to the outer frame (the short side D1 in FIG. 1) than the bumps 33 (the second bump) and 34. This means that, in the planar view of the principal surface 11 of the semiconductor substrate 10, the distance between the short side D1 and the bump 31 in the X-axis direction is shorter than the distance between the short side D1 and the bump 33. Further, the lengths of the bumps 31, 32 in the Y-axis direction are greater than the lengths of the bumps 33, 34 in the Y-axis direction. In the present embodiment, the lengths of the bumps 31 to 34 in the X-axis direction are the same, so that the areas of the bumps 31, 32 are larger than the areas of the bumps 33, 34 in the planar view of the principal surface 11 of the semiconductor substrate 10.

The attention will now be focused on the area of bump per unit transistor of the plurality of unit transistors. In the present specification, the term "the area of bump per unit transistor of the plurality of unit transistors" refers to a value obtained by dividing the area of a bump by the total number of the unit transistors arranged at least partly overlapping the bump in the planar view of the principal surface 11 of the semiconductor substrate 10. The value obtained by the division will be hereinafter referred to simply as "the area per unit of bump." Taking, for instance, the bump 31 as an example, the value obtained by dividing the area of the bump 31 by four, which is the total number of the unit transistors Q1 to Q4, is the area per unit of the bump 31. In the present embodiment, the areas of the bumps 31, 32 are larger than the areas of the bumps 33, 34, and the number of the unit transistors arranged at least partly overlapping each of the bumps 31 to 34 is four. Therefore, the area per unit of the bumps 31, 32 is larger than the area per unit of the bumps 33, 34.

In the semiconductor substrate 10, a region including a center in the planar view of the principal surface 11 is referred to as the central part, and a region from the outer rim of the central part to the outer frame of the semiconductor substrate 10 is referred to as the peripheral part. The sizes of the central part and the peripheral part are not particularly restricted. In the semiconductor substrate 10, the distance from the peripheral part to the outer frame is shorter than the distance from the central part to the outer frame, so that the region of heat dissipation is limited, leading to a lower degree of heat dissipation in some cases. In this case, increasing the area per unit of the bumps 31, 32 formed in the peripheral part relative to the bumps 33, 34 formed in the central part improves the degree of heat dissipation of the unit transistors formed in the peripheral part, as compared with the case where the area is equal or smaller, thus enabling a temperature rise to be suppressed. This leads to a lower maximum temperature of the unit transistors and less temperature variations among the unit transistors.

The unit transistors Q1 to Q4, Q5 to Q8, Q9 to Q12, and Q13 to Q16 are arranged at equal intervals according to, for example, the lengths of the corresponding bumps 31 to 34 in the Y-axis direction. Thus, among the unit transistors Q1 to Q4 and Q5 to Q8 of the transistor arrays 21 (the first transistor array), 22, the interval in the Y-axis direction between two adjacent unit transistors is larger than the interval in the Y-axis direction between two adjacent unit transistors among the unit transistors Q9 to Q12 and Q13 to Q16 of the transistor arrays 23 (the second transistor array), 24.

Further, in, for example, the bump 31, the unit transistors Q1 to Q4 are arranged, being displaced from the bump 31 in the X-axis direction rather than being placed right below the bump 31. More specifically, in the planar view of the principal surface 11 of the semiconductor substrate 10, the unit transistors Q1 to Q4 are arranged, being displaced to one side in the X-axis direction (in a positive direction in FIG. 1) from a centerline C2 extending in the Y-axis direction of the bump 31 and also at least partly overlapping the bump 31. With this arrangement, when the semiconductor substrate 10 is mounted on the mounting substrate, the stress applied to the unit transistors Q1 to Q4 via the bump 31 is lessened, thus enabling the failures of the unit transistors to be lessened. This applies to the remaining bumps. It should be noted that the present disclosure is not intended to exclude the configuration in which the unit transistors are formed right below the bumps.

As described above, in the semiconductor device 100A, the area per unit of the bumps formed in the peripheral part is larger than the area per unit of the bumps formed in the central part. With this arrangement, even in the case where the degree of heat dissipation of the peripheral part in the semiconductor substrate 10 is lower than that in the central part, the temperature rise in the peripheral part can be suppressed. Hence, the maximum temperature of the unit transistors can be decreased and the temperature variations can be reduced, as compared with a configuration (a semiconductor device 1000) in which the quantity of the unit transistors per bump and the area of each bump are formed to be the same, as illustrated in FIG. 2.

Further, although not illustrated, the temperature rise of the unit transistors can be suppressed also by, for example, connecting a base ballast resistor to the base of each unit transistor. However, if the value of resistance is increased as output power is increased, then a high frequency characteristic may be deteriorated. In this aspect, the present embodiment makes it possible to control the resistance value of the base ballast resistor to be lower than in the semiconductor device 1000 by devising the placement of the unit transistors and the bumps. Hence, the semiconductor device 100A can achieve a lower maximum temperature while maintaining a high frequency characteristic and also achieve a reduced temperature variation, as compared with the semiconductor device 1000.

In the present embodiment, the configuration in which the four transistor arrays and the four bumps are formed in each of the regions R1, R2 is illustrated. However, the number of the transistor arrays and the bumps formed in one region is not limited to four each, and any number may apply insofar as the number is two or more. Further, the number of the unit transistors provided in each transistor array is just an example and is not particularly restricted. The same applies to the remaining embodiments.

Further, the transistor arrays are not necessarily required to be adjoining to each other, and other elements or the like may be formed between any transistor arrays.

Further, FIG. 1 illustrates the example in which the amplifiers are formed in both the regions R1 and R2. Alternatively, however, only one of the regions may have the amplifiers. In this case, an element that is different from the amplifiers may be formed in the other region.

Figure 3:
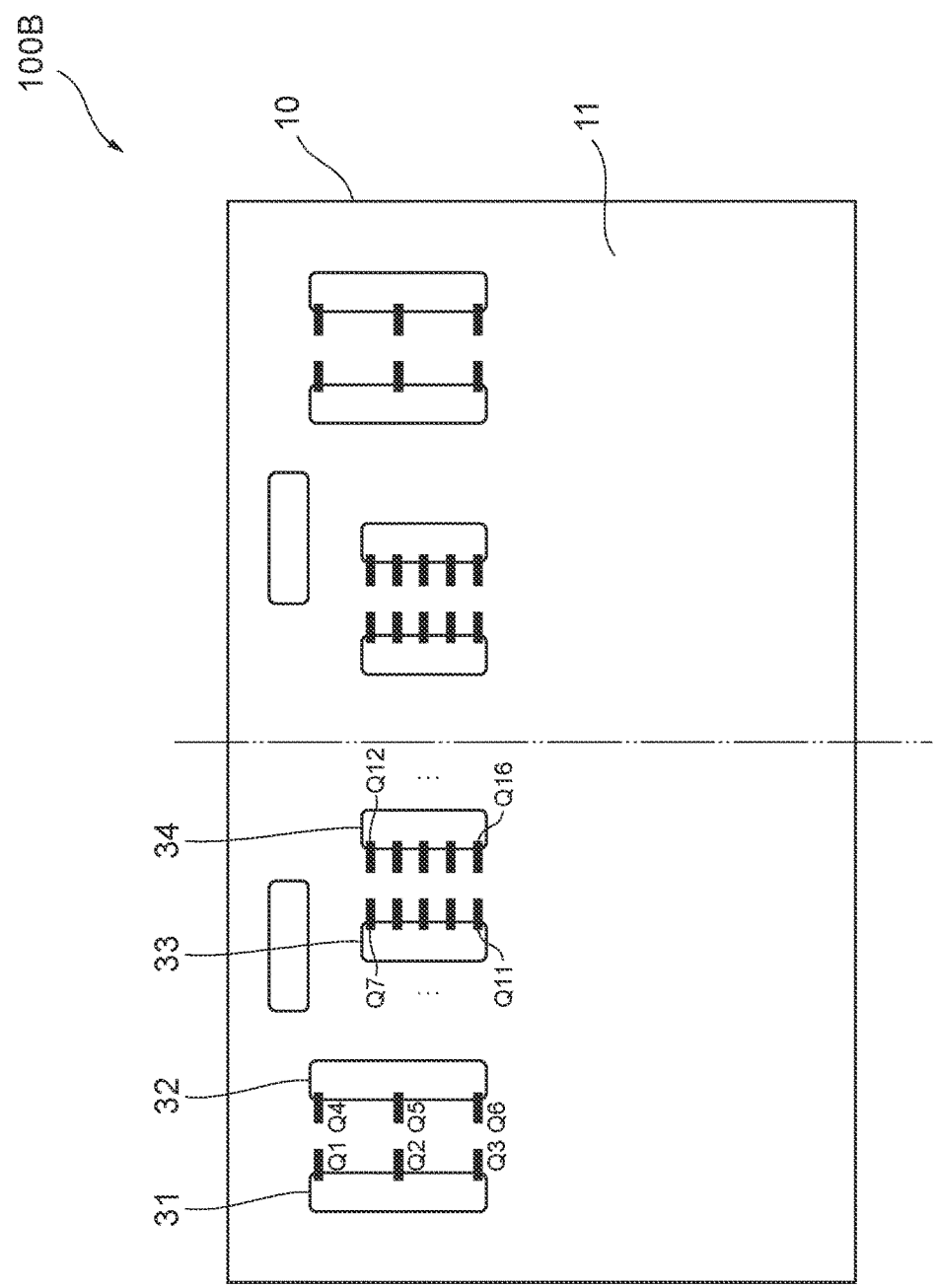
FIG. 3 is a plan view of a semiconductor device 100B according to a modification example of the first embodiment of the present disclosure.

FIG. 3 is a plan view of a semiconductor device 100B according to a modification example of the first embodiment of the present disclosure. In the following description, the same aspects as those of the first embodiment will not be described and only different aspects will be described. In particular, the description of like operations and effects obtained by like configurations will not be repeated in each embodiment. Further, for the sake of convenience of explanation, the same reference numerals as those in FIG. 1 will be used for the unit transistors Q1 to Q16 even if the placement differs from that in other embodiments or modification examples.

A semiconductor device 100B illustrated in FIG. 3 has bumps having the same shapes and the same total number of unit transistors as those of the semiconductor device 100A illustrated in FIG. 1, but differs in the placement of the unit transistors. More specifically, in the semiconductor device 100B, three unit transistors Q1 to Q3 (first unit transistors) and three unit transistors Q4 to Q6 are connected to bumps 31 (a first bump) and 32, respectively, five unit transistors Q7 to Q11 (second unit transistors) and five unit transistors Q12 to Q16 are connected to bumps 33 (a second bump) and 34, respectively. In other words, the number of the unit transistors connected to the bumps 31, 32 is smaller than the number of the unit transistors connected to the bumps 33, 34.

In the semiconductor device 100B having the configuration described above, the area per unit of the bumps 31, 32 is even larger than the area per unit of the bumps 33, 34, as compared with the semiconductor device 100A. Therefore, a further decrease in the maximum temperature and a further reduction in the temperature variation can be achieved, as compared with the semiconductor device 100A.

Figure 4:
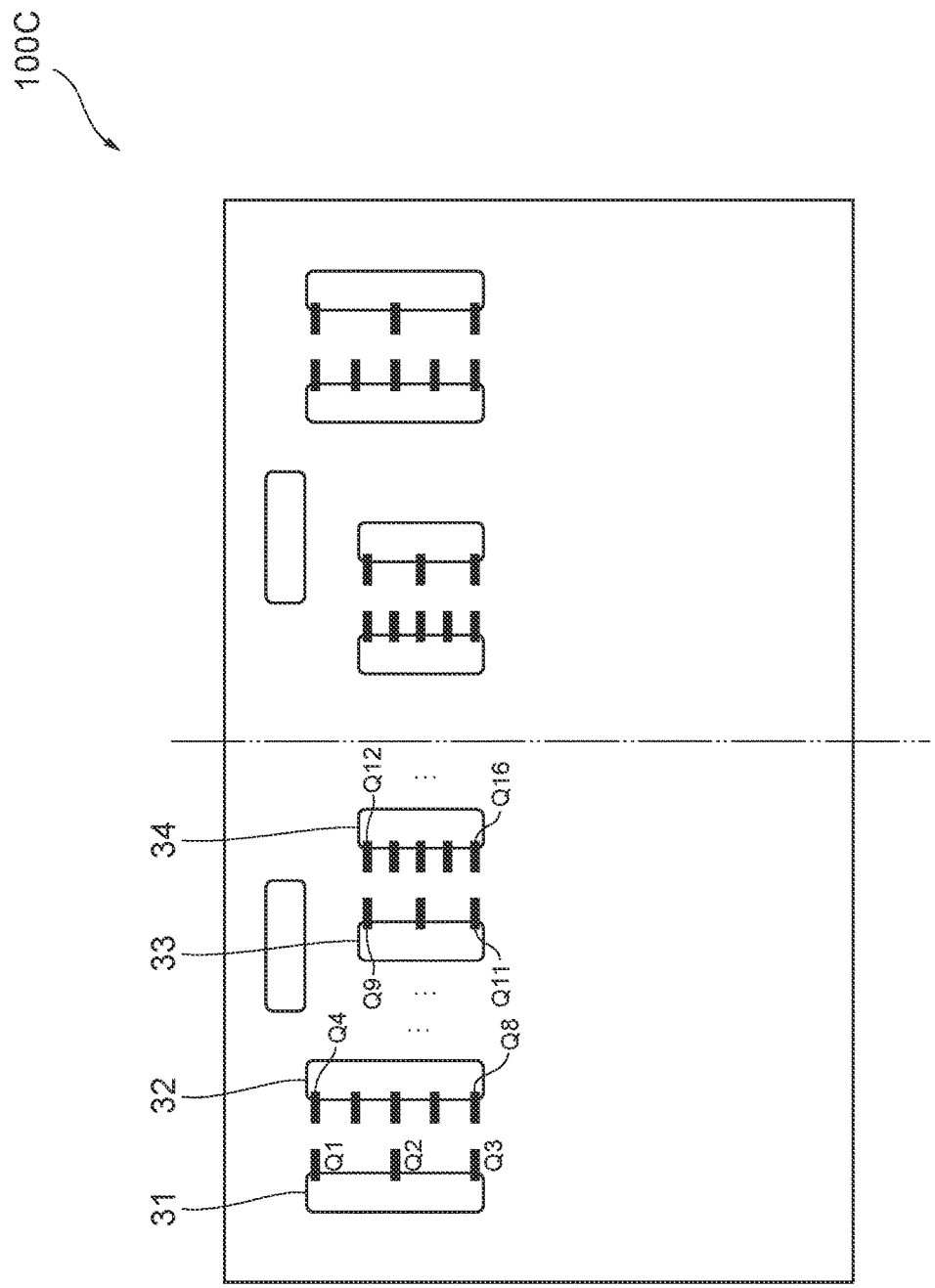
FIG. 4 is a plan view of a semiconductor device 100C according to a modification example of the first embodiment of the present disclosure.

FIG. 4 is a plan view of a semiconductor device 100C according to a modification example of the first embodiment of the present disclosure. The semiconductor device 100C illustrated in FIG. 4 has bumps having the same shapes and the same total number of unit transistors as those of the semiconductor device 100B, but differs in the placement of the unit transistors. More specifically, in the semiconductor device 100C, three unit transistors Q1 to Q3 (first unit transistors) and three unit transistors Q9 to Q11 are connected to bumps 31 (a first bump) and 33, respectively, five unit transistors Q4 to Q8 (second unit transistors) and five unit transistors Q12 to Q16 are connected to bumps 32 (a second bump) and 34, respectively.

In this configuration, the area per unit of the bump 31 (the first bump) is larger than the area per unit of the bumps 32 (the second bump) to 34. Hence, the same effects as those of the semiconductor device 100A can be obtained.

Figure 6:
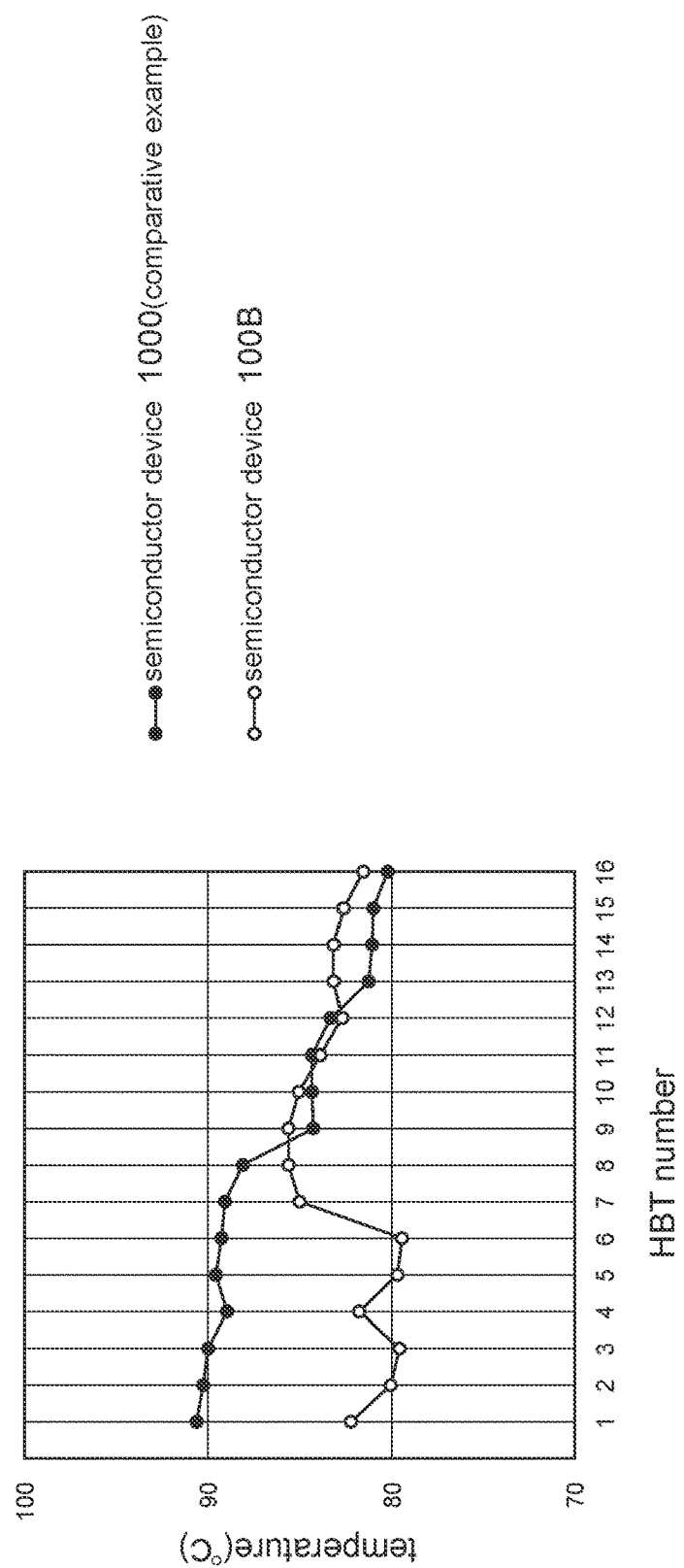
FIG. 6 is a graph showing a part of the simulation results illustrated in FIG. 5.

FIG. 5 illustrates simulation results indicating the temperature of each unit transistor in the first embodiment of the present disclosure and a modification example of the first embodiment and a comparative example. FIG. 6 is a graph showing a part of the simulation results illustrated in FIG. 5.

In the first embodiment and the modification example of the first embodiment and the comparative example illustrated in FIG. 5, the semiconductor devices 100A to 100C and the semiconductor device 1000 (the comparative example) have the configurations illustrated in FIG. 1, FIG. 3, FIG. 4, and FIG. 2, respectively. Regarding semiconductor devices 100D to 100H, the numbers of unit transistors included in the transistor arrays are indicated in order, starting from a short side D1. If configurations in which the lengths of bumps in the Y-axis direction are relatively great (corresponding to the bumps 31, 32 in FIG. 1) are denoted by a subscript L, then the semiconductor devices are denoted as follows: 100D ($4_L$/4/4/4), 100E (3/3/5/5), 100F ($3_L$/3/5/5), 100G (3/5/3/5), and 100H ($3_L$/5/3/5).

It is seen from FIG. 5 that all the semiconductor devices 100A to 100H exhibit improved maximum temperatures (max) or improved variations in temperature (o), or both improved maximum temperatures and improved variations in temperature, in comparison with the semiconductor device 1000, which is a comparative example.

FIG. 6 is a graph illustrating the temperature distributions of the semiconductor device 100B and the semiconductor device 1000 (the comparative example) of the simulation results illustrated in FIG. 5. In the graph, the axis of abscissas indicates the identifiers of the unit transistors Q1 to Q16, and the axis of ordinates indicates the temperature (° C.). As seen from FIG. 6, in the comparative example, the temperatures of the unit transistors Q1 to Q8 included in the two transistor arrays adjacent to the outer frame of the semiconductor substrate are higher than the temperatures of the unit transistors Q9 to Q16 included in the two transistor arrays formed in the vicinity of the central part of the semiconductor substrate. Meanwhile, in the semiconductor device 100B, it is seen that the temperatures of the unit transistors Q1 to Q6, in particular, which are included in the two transistor arrays adjacent to the outer frame are lower than those in the comparative example. From the graph, it is seen that the suppression of the temperature rise of the unit transistors formed in the peripheral part, in which the degree of heat dissipation is relatively low, has been achieved in the semiconductor device 100B.

Figure 7:
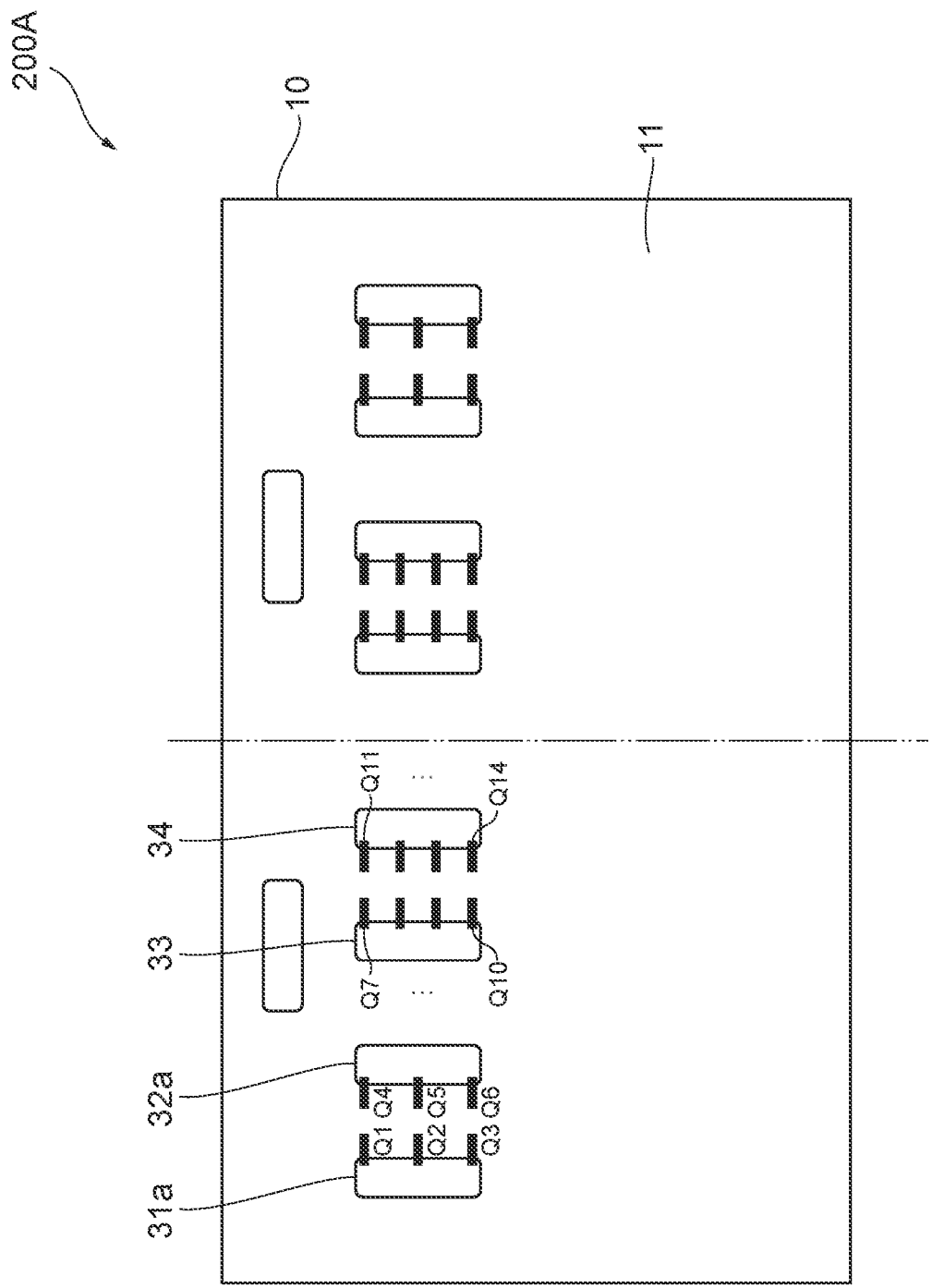
FIG. 7 is a plan view of a semiconductor device 200A according to a second embodiment of the present disclosure.
Figure 8:
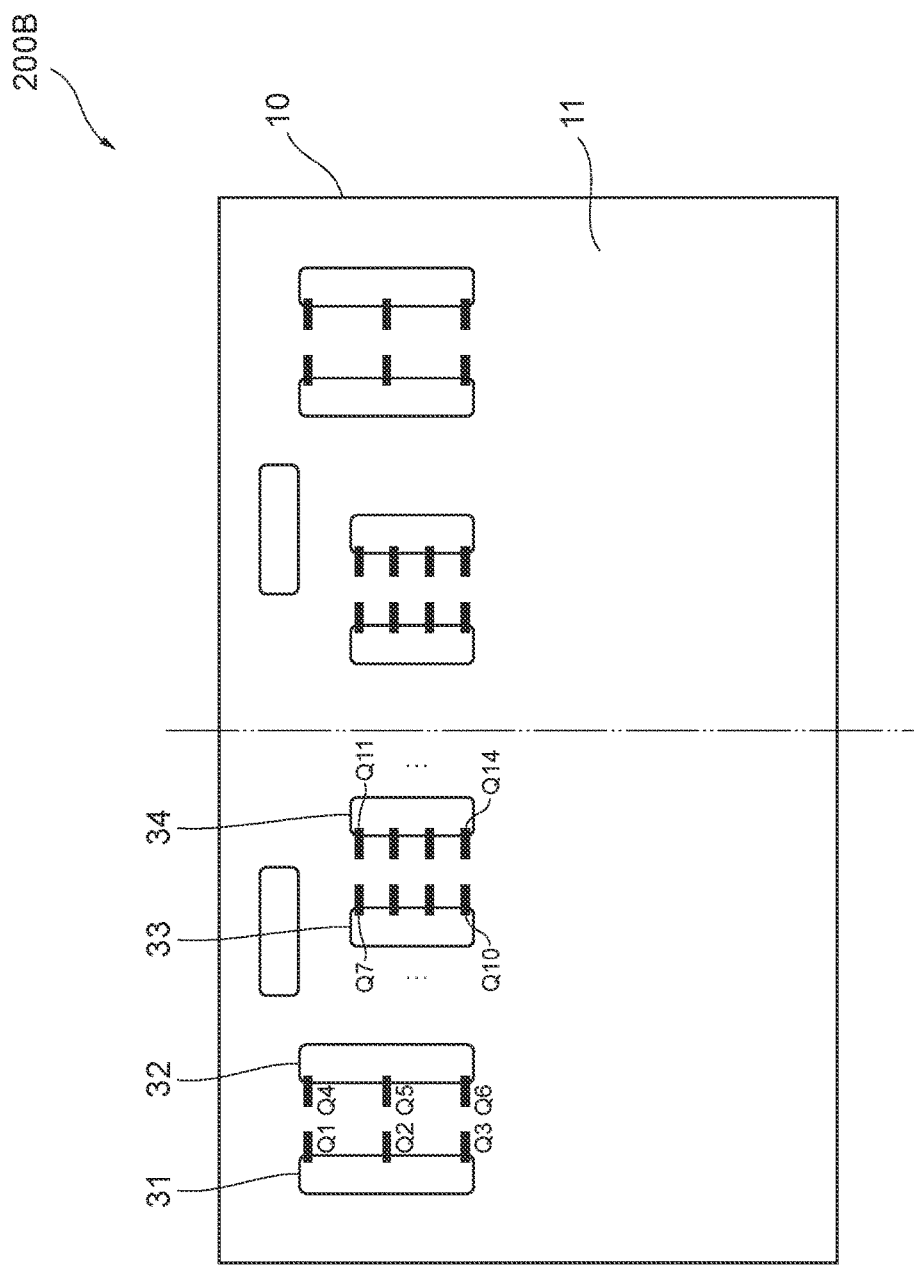
FIG. 8 is a plan view of a semiconductor device 200B according to a modification example of the second embodiment of the present disclosure.
Figure 9:
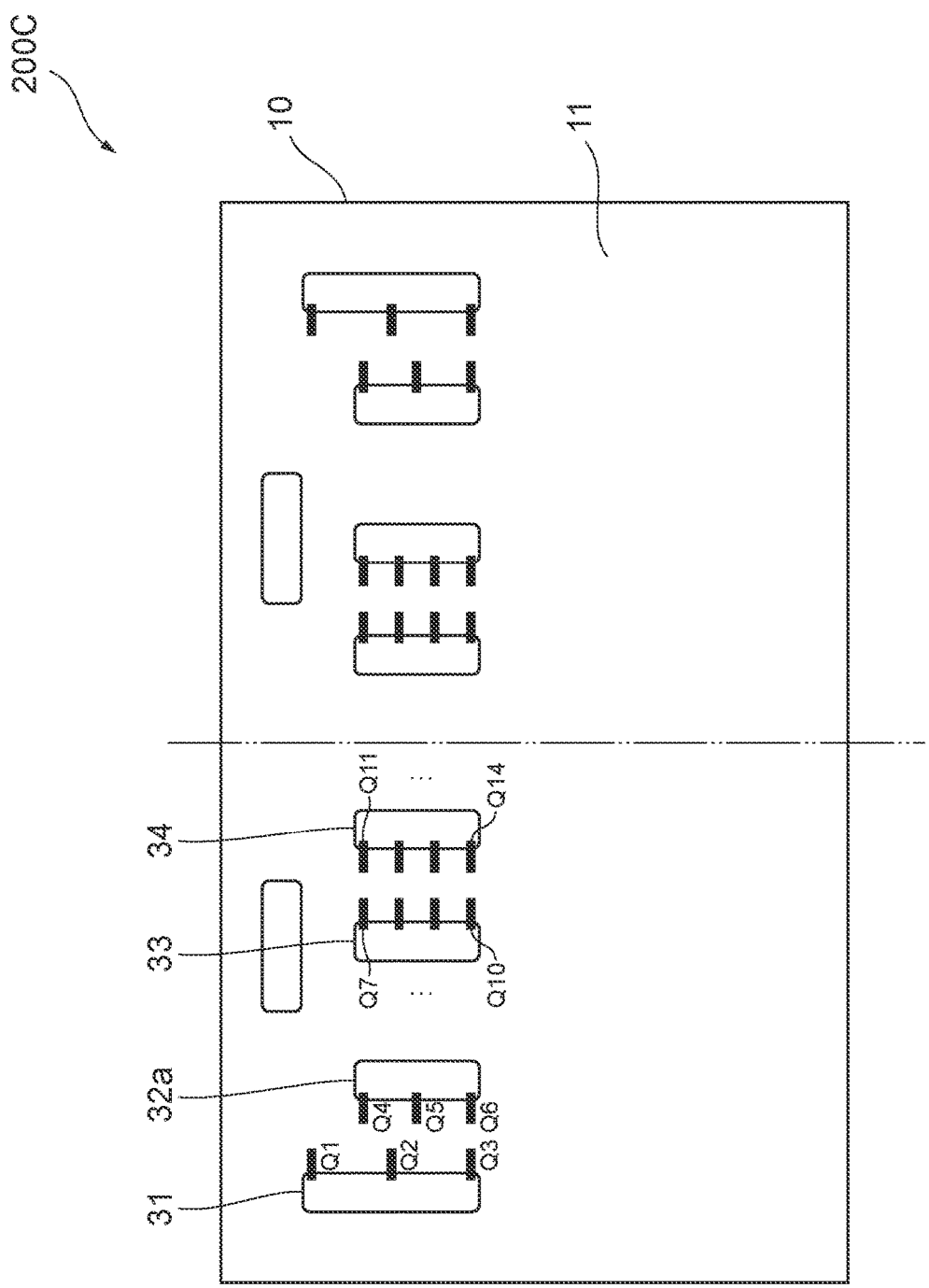
FIG. 9 is a plan view of a semiconductor device 200C according to a modification example of the second embodiment of the present disclosure.

Referring now to FIG. 7 to FIG. 9, semiconductor devices 200A to 200C according to a second embodiment of the present disclosure will be described. The total number of the unit transistors included in one amplifier is sixteen in the first embodiment, whereas the total number thereof is fourteen in the second embodiment.

FIG. 7 is a plan view of the semiconductor device 200A according to the second embodiment of the present disclosure. In the semiconductor device 200A, bumps 31a to 34 all have the same length, the same width, and the same area. Further, three unit transistors Q1 to Q3 (first unit transistors) and three unit transistors Q4 to Q6 are connected to the bumps 31a (a first bump) and 32a, respectively. Four unit transistors Q7 to Q10 (second unit transistors) and four unit transistors Q11 to Q14 are connected to bumps 33 (a second bump) and 34, respectively. In other words, the number of the unit transistors connected to the bumps 31a, 32a is smaller than the number of the unit transistors connected to the bumps 33, 34.

Thus, even when the areas of the bumps are the same, adjusting the allocation of the number of the unit transistors to be connected leads to a larger area per unit of the bumps 31a, 32a than the area per unit of the bumps 33, 34. Therefore, the same effects as those of the semiconductor device 100A can be obtained.

FIG. 8 is a plan view of the semiconductor device 200B according to a modification example of the second embodiment of the present disclosure. The semiconductor device 200B differs from the semiconductor device 200A in that the lengths of bumps 31 (a first bump), 32 are greater than the lengths of bumps 33 (a second bump), 34.

Thus, adjusting the areas of the bumps in addition to the number of the unit transistors to be connected to the bumps leads to an even larger area per unit of the bumps 31, 32 than the area per unit of the bumps 33, 34. Hence, a further lower maximum temperature and a further reduced variation in temperature can be achieved, as compared with the semiconductor device 200A.

FIG. 9 is a plan view of the semiconductor device 200C according to another modification example of the second embodiment of the present disclosure. The semiconductor device 200C differs from the semiconductor device 200B in that the length of only a bump 31 (a first bump) is greater than the lengths of the remaining bumps 32a (a second bump) to 34. This configuration can also provide the same effects as those obtained by the semiconductor device 200A.

Figure 11:
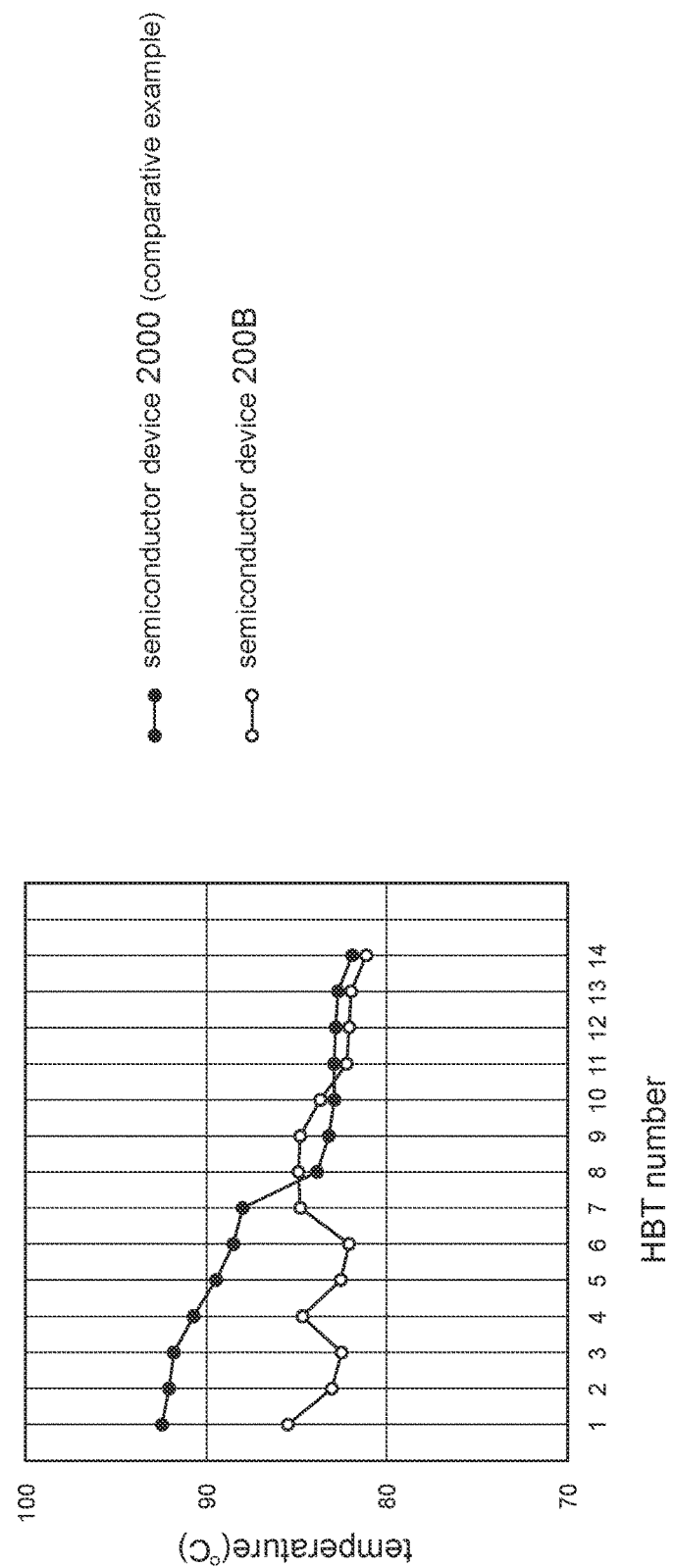
FIG. 11 is a graph illustrating a part of the simulation results illustrated in FIG. 10.

FIG. 10 illustrates the simulation results on the temperatures of the unit transistors in the second embodiment of the present disclosure and a modification example of the second embodiment, and a comparative example. FIG. 11 is a graph illustrating a part of the simulation results illustrated in FIG. 10.

In the second embodiment and the modification example of the second embodiment and the comparative example illustrated in FIG. 10, the semiconductor devices 200A to 200C have the configurations illustrated in FIG. 7, FIG. 8, and FIG. 9, respectively. Regarding the semiconductor devices 200D to 200G and a semiconductor device 2000 (the comparative example), the numbers of unit transistors included in the transistor arrays and the lengths of bumps in the Y-axis direction are denoted in the same manner as that in FIG. 5. The semiconductor devices are denoted as follows: 200D ($3_L/4_L/3/4$), 200E ($3_L/4/3/4$), 200F (3/4/4/3), 200G (3/4/3/4), and 2000 (4/3/3/4).

It is seen from FIG. 10 that all the semiconductor devices 200A to 200G exhibit improved maximum temperatures (max) or improved variations in temperature (σ), or both improved maximum temperatures and improved variations in temperature, in comparison with the semiconductor device 2000, which is a comparative example.

FIG. 11 is a graph illustrating the temperature distributions of the semiconductor device 200B and the semiconductor device 2000 (the comparative example) of the simulation results illustrated in FIG. 10. In the graph, the axis of abscissas indicates the identifiers of the unit transistors Q1 to Q14, and the axis of ordinates indicates the temperature (° C.). As seen from FIG. 11, in the comparative example, the temperatures of the unit transistors Q1 to Q7 included in the two transistor arrays adjacent to the outer frame of the semiconductor substrate are higher than the temperatures of the unit transistors Q8 to Q14 included in the two transistor arrays formed in the vicinity of the central part of the semiconductor substrate. Meanwhile, in the semiconductor device 200B, it is seen that the temperatures of the unit transistors Q1 to Q6, in particular, which are included in the two transistor arrays adjacent to the outer frame are lower than those in the comparative example. From the graph, it is seen that the suppression of the temperature rise of the unit transistors formed in the peripheral part, in which the degree of heat dissipation is relatively low, has been achieved in the semiconductor device 200B.

Figure 12:
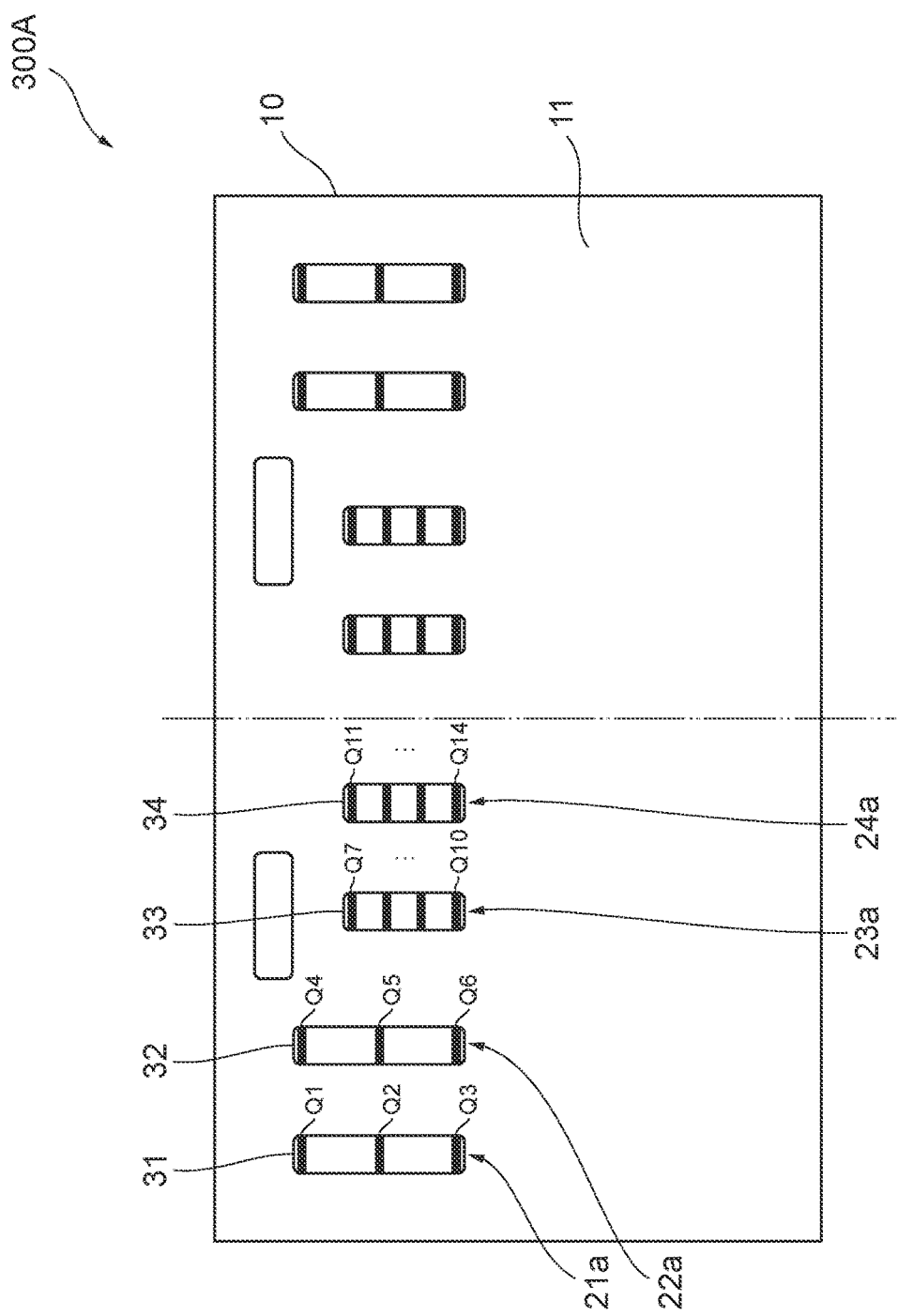
FIG. 12 is a plan view of a semiconductor device 300A according to a third embodiment of the present disclosure.

FIG. 12 is a plan view of a semiconductor device 300A according to a third embodiment of the present disclosure. The semiconductor device 300A has the same placement of unit transistors Q1 to Q14 as the placement in the semiconductor device 200B illustrated in FIG. 8, but has a different positional relationship between the unit transistors Q1 to Q14 and bumps 31 to 34. More specifically, in the semiconductor device 300A, four transistor arrays 21a to 24a, which include the unit transistors, and the bumps 31 to 34 are overlapped without being displaced in the planar view of a principal surface 11 of a semiconductor substrate 10. In other words, the bumps 31 to 34 are formed right above the transistor arrays 21a to 24a.

This configuration can also provide the same effects as those obtained by the semiconductor device 100A. The configuration of the present embodiment can be applied to other embodiments and modification examples.

Figure 13:
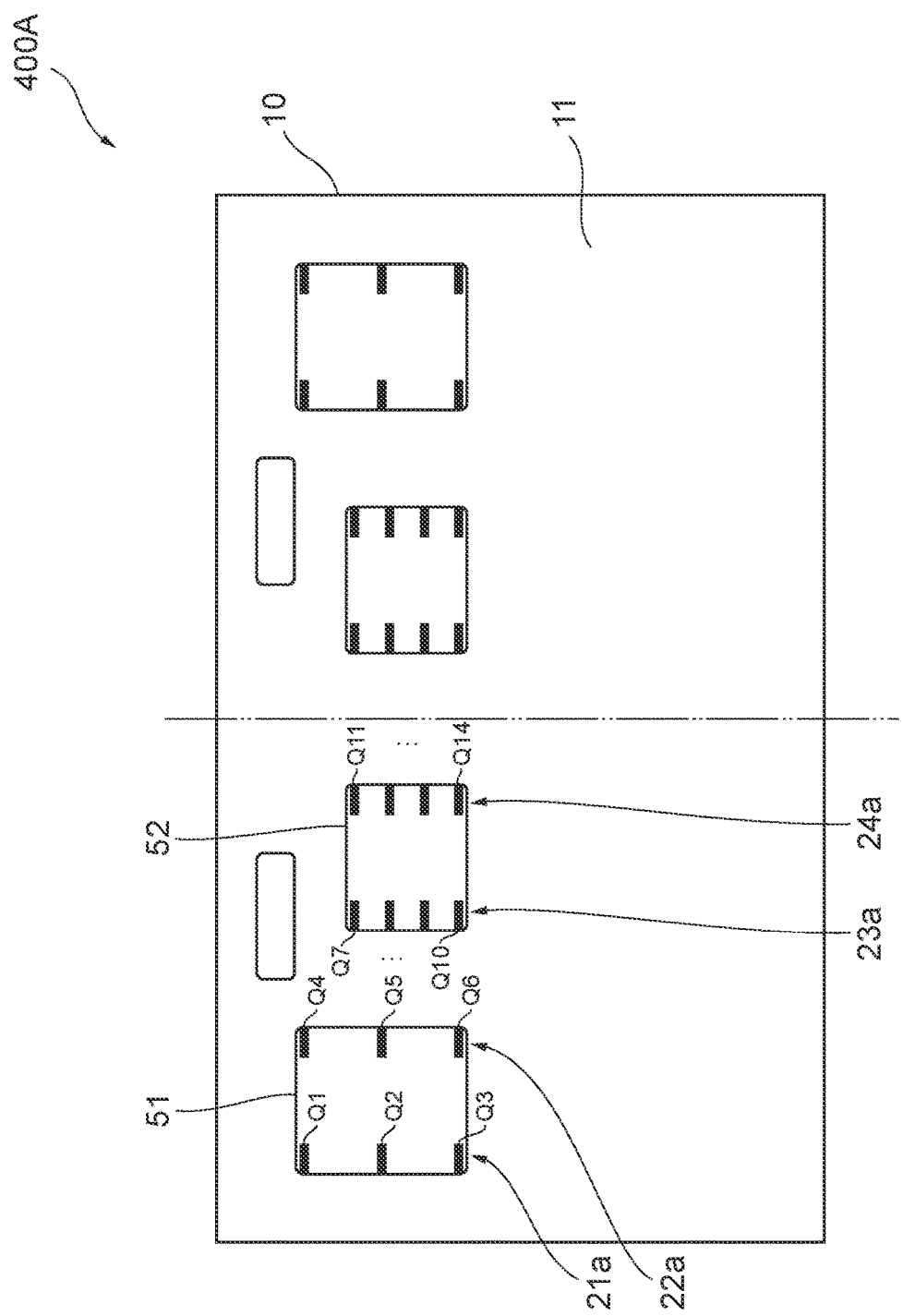
FIG. 13 is a plan view of a semiconductor device 400A according to a fourth embodiment of the present disclosure.

FIG. 13 is a plan view of a semiconductor device 400A according to a fourth embodiment of the present disclosure. The semiconductor device 400A has the same placement of unit transistors Q1 to Q14 as that of the semiconductor device 200B illustrated in FIG. 8, but has different bump shapes. More specifically, in the semiconductor device 400A, among four transistor arrays 21a to 24a, which include unit transistors, the unit transistors Q1 to Q3 (first unit transistors) and Q4 to Q6 (third unit transistors) included in two transistor arrays 21a (a first transistor array) and 22a (a third transistor array), which are adjacent to each other, are connected to a single bump 51 (a first bump). Similarly, the unit transistors Q7 to Q10 (second unit transistors) and Q11 to Q14 (fourth unit transistors) included in two transistor arrays 23a (a second transistor array) and 24a (a fourth transistor array), which are adjacent to each other, are connected to a single bump 52 (a second bump). Thus, the configuration of a bump is not limited to the configuration in which bumps are provided on a one-to-one basis, and may be the one in which a single bump is connected to two or more transistor arrays.

In the configuration described above, the area per unit of the bump 51 is larger than the area per unit of the bump 52. Hence, the same effects as those of the semiconductor device 100A can be obtained. Further, in the semiconductor device 400A, a bump is also formed between transistor arrays, thus making it possible to secure a larger bump area than in other embodiments. Therefore, a further decrease in the maximum temperature and a further reduced variation in temperature, as compared with other embodiments, can be achieved. The configuration of the present embodiment can be applied to other embodiments and modification examples.

Figure 14:
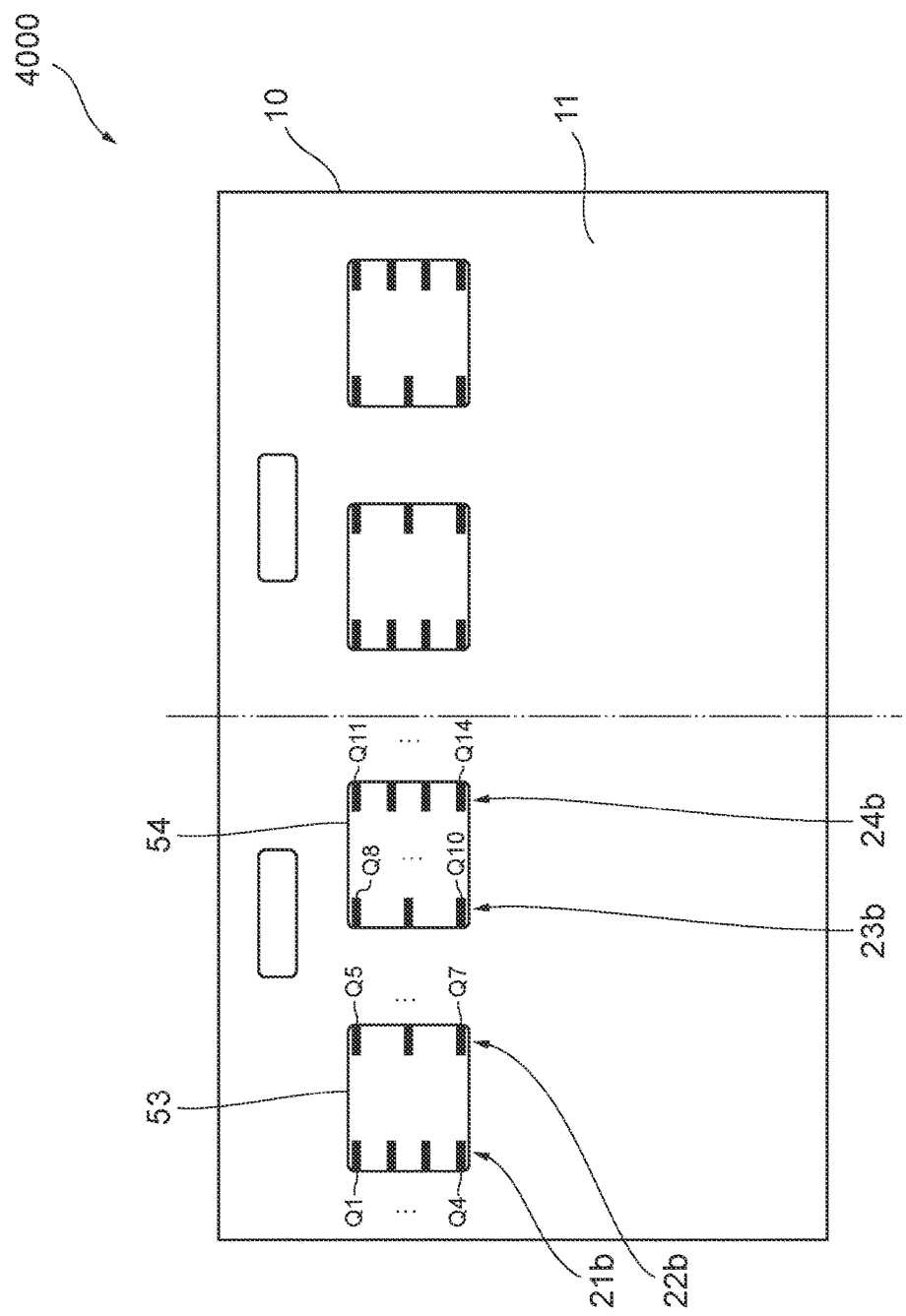
FIG. 14 is a plan view of a semiconductor device 4000 according to a reference example.

FIG. 14 is a plan view of a semiconductor device 4000 according to a reference example. In the semiconductor device 4000, the numbers of unit transistors included in transistor arrays 21b to 24b are four, three, three, and four, respectively. Further, as with the semiconductor device 400A illustrated in FIG. 13, the transistor arrays 21b and 22b are connected to a single bump 53, and the transistor arrays 23b and 24b are connected to a single bump 54. Further, the areas of the two bumps 53 and 54 are the same.

Figure 16:
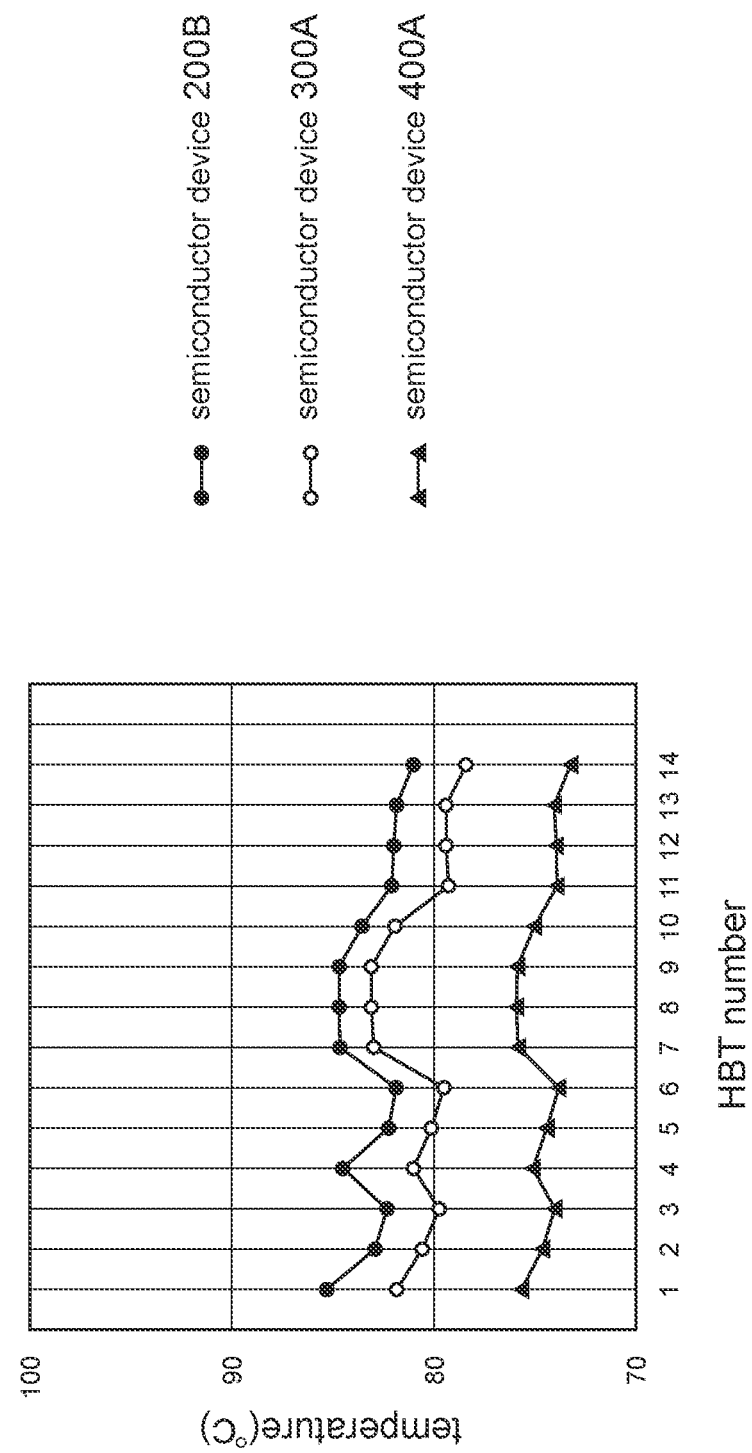
FIG. 16 is a graph illustrating a part of the simulation results illustrated in FIG. 10 and FIG. 15.

FIG. 15 illustrates simulation results indicating the temperature of each unit transistor in the third embodiment and the fourth embodiment of the present disclosure, the comparative example, and the reference example. FIG. 16 is a graph illustrating a part of the simulation results illustrated in FIG. 10 and FIG. 15.

The semiconductor devices 300A, 400A, and 4000 illustrated in FIG. 15 have the configurations illustrated in FIG. 12, FIG. 13, and FIG. 14, respectively. In the semiconductor device 3000 (the comparative example), the numbers of the unit transistors included in the transistor arrays are four, three, three, and four in this order from a short side D1. The areas of the four bumps are all the same, and the transistor arrays and the bumps are overlapped without being displaced.

It is seen from FIG. 15 that all the semiconductor devices 300A, 400A, and 4000 exhibit improved maximum temperatures and improved variations in temperature, in comparison with the semiconductor device 2000 (the comparative example) illustrated in FIG. 10. Especially in the semiconductor device 400A, the maximum temperature is lower by approximately 16 degrees than that of the semiconductor device 2000, and the variation in temperature is also less.

FIG. 16 is a graph illustrating the temperature distributions of the semiconductor devices 200B, 300A, and 400A of the simulation results illustrated in FIG. 10 and FIG. 15. In the graph, the axis of abscissas indicates the identifiers of the unit transistors Q1 to Q14, and the axis of ordinates indicates the temperature (° C.). In the semiconductor devices 200B, 300A, and 400A, the placements of all the unit transistors are the same, but the positions where bumps are formed are different or the areas of the bumps are different. As illustrated in FIG. 16, the semiconductor device 300A exhibits a lower temperature as a whole in comparison with the semiconductor device 200B. Further, the semiconductor device 400A exhibits an even lower temperature as a whole in comparison with the semiconductor device 300A. This means that the semiconductor device 400A has achieved a lower maximum temperature and also a lower temperature as a whole in the unit transistors by increasing the areas of the bumps in addition to devising the placement of the unit transistors The above has described the illustrative embodiments of the present disclosure. Each of the semiconductor devices 100A to 100H, 200A to 200G, 300A, and 400A has the transistor arrays and the bumps placed at the positions closer to the short side D1 of the semiconductor substrate 10, and the transistor arrays and the bumps placed at the positions farther from the short side D1. The area per unit of the bump closer to the short side D1 is larger than the area per unit of the bump farther from the short side D1. This makes it possible to suppress the temperature rise in the peripheral part of the semiconductor substrate 10. Thus, the maximum temperatures of the unit transistors can be decreased and the variations in temperature can be reduced, as compared with the configuration in which the bumps are formed to have the same area per unit.

Further, in the semiconductor devices 100A to 100H, 200A to 200G, 300A, and 400A, the intervals between the unit transistors of the transistor arrays placed at the positions closer to the short side D1 of the semiconductor substrate 10 are larger than the intervals between the unit transistors of the transistor arrays placed at the positions farther from the short side D1. Thus, the area per unit of the bumps closer to the short side D1 can be made larger than the area per unit of the bumps farther from the short side D1 in the case where the lengths of the bumps in the X-axis direction are the same.

Further, in the semiconductor devices 100C, 100E, 100G, 200A, 200D, 200F, and 200G, the number of the unit transistors of the transistor arrays placed at the positions closer to the short side D1 of the semiconductor substrate 10 is smaller than the number of the unit transistors of the transistor arrays placed at the positions farther from the short side D1. Thus, even in the case where the areas of the bumps are the same, the area per unit of the bumps closer to the short side D1 can be made larger than the area per unit of the bumps farther from the short side D1.

Further, in the semiconductor devices 100A, 100D, 100F, 200A, and 200C, the lengths in the Y-axis direction of the bumps placed at the positions closer to the short side D1 of the semiconductor substrate 10 are greater than the lengths in the Y-axis direction of the bumps placed at the positions farther from the short side D1. Thus, the area per unit of the bumps closer to the short side D1 can be made larger than the area per unit of the bumps farther from the short side D1 even if the numbers of the unit transistors connected to the bumps are the same.

Further, the lengths in the X-axis direction of the bumps placed at the positions closer to the short side D1 of the semiconductor substrate 10 may be greater than the lengths in the X-axis direction of the bumps placed at the positions farther from the short side D1. In this case also, the area per unit of the bumps closer to the short side D1 can be made larger than the area per unit of the bumps farther from the short side D1 even if the numbers of the unit transistors connected to the bumps are the same.

Further, in the semiconductor devices 100A to 100H, 200A to 200G, 300A, and 400A, the bumps are electrically connected to the emitters of the unit transistors. More current passes through the emitters than other terminals, so that the effect for suppressing a temperature rise is enhanced, as compared with the case where the bumps are connected to other terminals.

Further, in the semiconductor devices 100A to 100H and 200A to 200G, the transistor arrays are arranged, being displaced in the X-axis direction in relation to the bumps. This arrangement makes it possible to reduce the stress applied to the unit transistors through the bumps when the semiconductor substrate 10 is installed on a mounting substrate, thus enabling a reduction of failures of the unit transistors.

Further, in the semiconductor device 400A, the bumps 51, 52 are formed such that the unit transistors included in the two transistor arrays each at least partly overlap the bumps 51, 52. With this arrangement, the bump is also formed between the transistor arrays, so that a larger bump area than that in the remaining embodiments can be secured. Hence, a further decrease in the maximum temperature and further reduced variations in temperature can be achieved.

In all the embodiments described above, the lengths in the X-axis direction of the bumps are fixed. However, the areas of the bumps may be adjusted by adjusting the lengths in the X-axis direction of the bumps. More specifically, the bumps may be formed such that the lengths in the X-axis direction of the bumps closer to the outer frame of the semiconductor substrate are greater than the lengths in the X-axis direction of the bumps farther from the outer frame.

Further, in all the embodiments described above, the principal surface 11 of the semiconductor substrate 10 has the short sides in parallel to the Y-axis direction and the long sides in parallel to the X-axis direction. Alternatively, however, the principal surface 11 may have long sides in parallel to the Y-axis direction and the short sides in parallel to the X-axis direction.

The embodiments described above are intended for making it easy to understand the present disclosure and are not to be interpreted as limiting the present disclosure. The present disclosure may be modified or improved without departing from the spirit of the present disclosure, and equivalents thereof are also covered by the present disclosure. In other words, those obtained by adding design changes, as appropriate, to the embodiments by persons skilled in the art are encompassed by the scope of the present disclosure insofar as the characteristics of the present disclosure are incorporated. For example, the elements provided in the embodiments, and the placement, the materials, the conditions, the shapes, the sizes, and the like of the elements are not limited to the illustrated ones and may be changed, as appropriate. Further, the elements provided in the embodiments may be combined insofar as the combinations are technologically possible, and such combinations are to be covered by the scope of the present disclosure insofar as the characteristics of the present disclosure are incorporated.

What is claimed is:

1. A semiconductor device comprising:
   a semiconductor substrate having an approximately rectangular principal surface which has a first side in a first direction and a second side in a second direction which intersects with the first direction;
   a plurality of transistor arrays formed on the semiconductor substrate; and
   a plurality of bumps formed on the semiconductor substrate,
   wherein the plurality of bumps include a first bump and a second bump lengths of which in the first direction are greater than lengths in the second direction in a planar view of the principal surface of the semiconductor substrate,
   the first bump and the second bump are arranged along the second direction such that a distance between the first side and the first bump in the second direction is shorter than a distance between the first side and the second bump in the second direction in the planar view of the principal surface of the semiconductor substrate,
   the length of the first bump in the first direction is greater than the length of the second bump in the first direction,
   the plurality of transistor arrays include a first transistor array and a second transistor array which are arranged along the second direction,
   the first transistor array has a plurality of first unit transistors arranged along the first direction such that the first unit transistors at least partly overlap the first bump in the planar view of the principal surface of the semiconductor substrate, and
   the second transistor array has a plurality of second unit transistors arranged along the first direction such that the second unit transistors at least partly overlap the second bump in the planar view of the principal surface of the semiconductor substrate.

2. The semiconductor device according to claim 1, wherein an interval between two adjacent first unit transistors in the first direction in the first transistor array is larger than an interval between two adjacent second unit transistors in the first direction in the second transistor array.

3. The semiconductor device according to claim 1, wherein a number of the plurality of first unit transistors included in the first transistor array is smaller than a number of the plurality of second unit transistors included in the second transistor array.

4. The semiconductor device according to claim 2, wherein a number of the plurality of first unit transistors included in the first transistor array is smaller than a number of the plurality of second unit transistors included in the second transistor array.

5. The semiconductor device according to claim 1, wherein the first bump is electrically connected to a collector of each of the plurality of first unit transistors, and
   the second bump is electrically connected to a collector of each of the plurality of second unit transistors.

6. The semiconductor device according to claim 2, wherein the first bump is electrically connected to a collector of each of the plurality of first unit transistors, and
   the second bump is electrically connected to a collector of each of the plurality of second unit transistors.

7. The semiconductor device according to claim 3, wherein the first bump is electrically connected to a collector of each of the plurality of first unit transistors, and
   the second bump is electrically connected to a collector of each of the plurality of second unit transistors.

8. The semiconductor device according to claim 1, wherein the length of the first bump in the second direction is greater than the length of the second bump in the second direction.

9. The semiconductor device according to claim 2, wherein the length of the first bump in the second direction is greater than the length of the second bump in the second direction.

10. The semiconductor device according to claim 3, wherein the length of the first bump in the second direction is greater than the length of the second bump in the second direction.

11. The semiconductor device according to claim 4, wherein the length of the first bump in the second direction is greater than the length of the second bump in the second direction.

12. The semiconductor device according to claim 1, wherein the first bump is electrically connected to an emitter of each of the plurality of first unit transistors, and
    the second bump is electrically connected to an emitter of each of the plurality of second unit transistors.

13. The semiconductor device according to claim 2, wherein the first bump is electrically connected to an emitter of each of the plurality of first unit transistors, and
    the second bump is electrically connected to an emitter of each of the plurality of second unit transistors.

14. The semiconductor device according to claim 3, wherein the first bump is electrically connected to an emitter of each of the plurality of first unit transistors, and
    the second bump is electrically connected to an emitter of each of the plurality of second unit transistors.

15. The semiconductor device according to claim 1, wherein each of the plurality of first unit transistors is placed on one side in the second direction with respect to a centerline extending in the first direction of the first bump, and
    each of the plurality of second unit transistors is placed on one side in the second direction with respect to a centerline extending in the first direction of the second bump.

16. The semiconductor device according to claim 2, wherein each of the plurality of first unit transistors is placed on one side in the second direction with respect to a centerline extending in the first direction of the first bump, and each of the plurality of second unit transistors is placed on one side in the second direction with respect to a centerline extending in the first direction of the second bump.

17. The semiconductor device according to claim 1, wherein the plurality of transistor arrays further include:
a third transistor array placed adjacently to the first transistor array in the second direction; and
a fourth transistor array placed adjacently to the second transistor array in the second direction,
wherein the third transistor array has a plurality of third unit transistors placed along the first direction such that the third unit transistors at least partly overlap the first bump in the planar view of the principal surface of the semiconductor substrate,
the fourth transistor array has a plurality of fourth unit transistors placed along the first direction such that the fourth unit transistors at least partly overlap the second bump in the planar view of the principal surface of the semiconductor substrate, and
an area of the first bump per one of the plurality of first unit transistors and the plurality of third unit transistors is larger than an area of the second bump per one of the plurality of second unit transistors and the plurality of fourth unit transistors in the planar view of the principal surface of the semiconductor substrate.

18. The semiconductor device according to claim 2, wherein the plurality of transistor arrays further include:
a third transistor array placed adjacently to the first transistor array in the second direction; and
a fourth transistor array placed adjacently to the second transistor array in the second direction,
wherein the third transistor array has a plurality of third unit transistors placed along the first direction such that the third unit transistors at least partly overlap the first bump in the planar view of the principal surface of the semiconductor substrate,
the fourth transistor array has a plurality of fourth unit transistors placed along the first direction such that the fourth unit transistors at least partly overlap the second bump in the planar view of the principal surface of the semiconductor substrate, and
an area of the first bump per one of the plurality of first unit transistors and the plurality of third unit transistors is larger than an area of the second bump per one of the plurality of second unit transistors and the plurality of fourth unit transistors in the planar view of the principal surface of the semiconductor substrate.

19. The semiconductor device according to claim 3, wherein the plurality of transistor arrays further include:
a third transistor array placed adjacently to the first transistor array in the second direction; and
a fourth transistor array placed adjacently to the second transistor array in the second direction,
wherein the third transistor array has a plurality of third unit transistors placed along the first direction such that the third unit transistors at least partly overlap the first bump in the planar view of the principal surface of the semiconductor substrate,
the fourth transistor array has a plurality of fourth unit transistors placed along the first direction such that the fourth unit transistors at least partly overlap the second bump in the planar view of the principal surface of the semiconductor substrate, and
an area of the first bump per one of the plurality of first unit transistors and the plurality of third unit transistors is larger than an area of the second bump per one of the plurality of second unit transistors and the plurality of fourth unit transistors in the planar view of the principal surface of the semiconductor substrate.

20. The semiconductor device according to claim 4, wherein the plurality of transistor arrays further include:
a third transistor array placed adjacently to the first transistor array in the second direction; and
a fourth transistor array placed adjacently to the second transistor array in the second direction,
wherein the third transistor array has a plurality of third unit transistors placed along the first direction such that the third unit transistors at least partly overlap the first bump in the planar view of the principal surface of the semiconductor substrate,
the fourth transistor array has a plurality of fourth unit transistors placed along the first direction such that the fourth unit transistors at least partly overlap the second bump in the planar view of the principal surface of the semiconductor substrate, and
an area of the first bump per one of the plurality of first unit transistors and the plurality of third unit transistors is larger than an area of the second bump per one of the plurality of second unit transistors and the plurality of fourth unit transistors in the planar view of the principal surface of the semiconductor substrate.

* * * * *